United States Patent
Krysak et al.

(10) Patent No.: US 11,862,463 B2
(45) Date of Patent: Jan. 2, 2024

(54) METAL OXIDE NANOPARTICLES AS FILLABLE HARDMASK MATERIALS

(71) Applicant: Intel Corporation, Santa Clara, CA (US)

(72) Inventors: Marie Krysak, Portland, OR (US); Florian Gstrein, Portland, OR (US); Manish Chandhok, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 14 days.

(21) Appl. No.: 17/544,684

(22) Filed: Dec. 7, 2021

(65) Prior Publication Data

US 2022/0093399 A1 Mar. 24, 2022

Related U.S. Application Data (62) Division of application No. 16/316,990, filed as application No. PCT/US2016/055025 on Sep. 30, 2016.

(51) Int. Cl.

| | |
|---|---|
| *H01L 21/033* | (2006.01) |
| *C01G 27/02* | (2006.01) |
| *C01G 19/02* | (2006.01) |
| *C01G 23/04* | (2006.01) |
| *C01F 7/02* | (2022.01) |
| *C01G 25/02* | (2006.01) |
| *H01L 21/02* | (2006.01) |

(Continued)

(52) U.S. Cl.
CPC .......... *H01L 21/0332* (2013.01); *C01F 7/00* (2013.01); *C01F 7/02* (2013.01); *C01G 19/02* (2013.01);

(Continued)

(58) Field of Classification Search
CPC ........... H01L 21/02282; H01L 21/0332; C07F 5/061; C07F 5/068; C01B 13/32
See application file for complete search history.

(56) References Cited

U.S. PATENT DOCUMENTS

2011/0039105 A1 2/2011 Zimmerman et al.
2013/0011630 A1\* 1/2013 Sullivan .............. H01L 21/0276
430/326

(Continued)

OTHER PUBLICATIONS

Ramos-González, Rodolfo & García-Cerda, L. & Alshareef, Husam & Gnade, Bruce & Quevedo-Lopez, Ma. (2010). Study of Hafnium (IV) Oxide Nanoparticles Synthesized by Polymerized Complex and Polymer Precursor Derived Sol-Gel Methods. Materials Science Forum. 644. 10.4028/www.scientific.net/MSF.644.75 (Year: 2014).\*

(Continued)

*Primary Examiner* — Alia Sabur
(74) *Attorney, Agent, or Firm* — Schwabe, Williamson & Wyatt, P.C.

(57) ABSTRACT

A dielectric composition including a metal oxide particle including a diameter of 5 nanometers or less capped with an organic ligand at at least a 1:1 ratio. A method including synthesizing metal oxide particles including a diameter of 5 nanometers or less; and capping the metal oxide particles with an organic ligand at at least a 1:1 ratio. A method including forming an interconnect layer on a semiconductor substrate; forming a first hardmask material and a different second hardmask material on the interconnect layer, wherein at least one of the first hardmask material and the second hardmask material is formed over an area of interconnect layer target for a via landing and at least one of the first hardmask material and the second hardmask material include metal oxide nanoparticles; and forming an opening to the interconnect layer selectively through one of the first hardmask material and the second hardmask material.

8 Claims, 7 Drawing Sheets

M = Hf, Zr, Ti, Sn, etc.

(51) Int. Cl.
*C01F 7/00* (2022.01)
*H01L 21/311* (2006.01)
*H01L 21/768* (2006.01)

(52) U.S. Cl.
CPC ............. *C01G 23/04* (2013.01); *C01G 25/02* (2013.01); *C01G 27/02* (2013.01); *H01L 21/02181* (2013.01); *H01L 21/02186* (2013.01); *H01L 21/02282* (2013.01); *H01L 21/31144* (2013.01); *H01L 21/76829* (2013.01); *H01L 21/76834* (2013.01); *H01L 21/76838* (2013.01); *H01L 21/76897* (2013.01); *C01P 2004/64* (2013.01)

(56) References Cited

U.S. PATENT DOCUMENTS

2015/0170926 A1   6/2015  Michalak et al.
2015/0234272 A1*  8/2015  Sarma .................. G03F 7/0045
                                                                430/326

OTHER PUBLICATIONS

International Search Report and Written Opinion for International Patent Application No. PCT/US2016/055025 dated Jun. 29, 2017, 12 pgs.

Li, Li et al., Solubility studies of inorganic-organic hybrid nanoparticle photoresists with different surface functional groups, Nanoscale, Dec. 15, 2015 (e-pub), vol. 8, No. 3, pp. 1338-1343 See pp. 1338-1340.

Sahraneshin, Ameneh et al., "Synthesis of shape-controlled and organic-hybridized hafnium oxide" nanoparticles under sub- and supercritical hydrothermal conditions, The Journal of Supercritical Fluids, 2012, vol. 62, pp. 190-196 See abstract; and pp. 190-192.

International Preliminary Report on Patentability for International Patent Application No. PCT/US2016/055025 dated Apr. 11, 2019, 9 pgs.

* cited by examiner

M = Hf, Zr, Ti, Sn, etc.

METAL OXIDE NANOPARTICLES AS FILLABLE HARDMASK MATERIALS

CROSS-REFERENCE TO RELATED APPLICATION

This patent application is a divisional of U.S. patent application Ser. No. 16/316,990 filed Jan. 10, 2019, which is a U.S. National Phase Application under 35 U.S.C. § 371 of International Application No. PCT/US2016/055025, filed Sep. 30, 2016, entitled "METAL OXIDE NANOPARTICLES AS FILLABLE HARDMASK MATERIALS," which designates the United States of America, the entire disclosures of which are hereby incorporated by reference in their entirety and for all purposes.

BACKGROUND

Field

Integrated circuit processing.

Description of Related Art

Certain integration schemes require the use of multiple hardmasks to successfully land a via on top of one metal structure without shorting to a neighboring metal. Current hardmasks that are capable of filling 30 pitch dimensions and below generally suffer from a lack of etch selectivity post-processing.

DETAILED DESCRIPTION

A dieelectric composition is disclosed as is a method of forming a dielectric composition and its use. In one embodiment, the dielectric composition is operable for use in integrated circuit structures as a dielectric layer on a device layer such as a dielectric layer as a mask (e.g., a hardmask) on an interconnect layer (e.g., metal line or other contact point) to allow the selective formation of openings to the interconnect layer. The dielectric composition is operable to fill tight pitch features (e.g., pitch feature of 30 nanometers or less) and demonstrates relatively high etch selectivity compared to other hardmask materials such as silicon nitride or silicon carbide.

In one embodiment, the dielectric composition includes metal oxide particles having a diameter of five nanometers (nm) or less that are capped with an organic ligand at at least a one to one (1:1) ratio. Suitable metals for the metal oxide particles include but are not limited to hafnium, zirconium, titanium, aluminum and tin. The metal oxide particles can be synthesized by a variety of methods, such as sol gel hydrolysis-condensation using metal alkoxide precursors and reduction of metal halides. Equations 1-3 below show representative ways to synthesize metal oxide particles. Equation 1 shows a condensation between a metal halide of, for example, hafnium, zirconium, titanium, aluminum, or tin (with X representing a halide (e.g., chloride, iodide) and a metal alkoxide (formed, for example, by the reaction of metal halides with alcohols). The condensation produces a metal oxide and an alkyl halide. One example would be the reaction of titanium isopropoxide and titanium chloride. Equation 2 describes another condensation operation leading to metal oxides. Equation 2 describes an ether elimination process involving condensation of two metal alkoxides under elimination of an organic ether.

Equation 3 is a further condensation process using an ester elimination process involving the reaction of metal carboxylates and metal alkoxides.

$$M\text{-}X + R\text{-}O\text{-}M \rightarrow M\text{-}O\text{-}M + R\text{—}X \qquad \text{Equation 1:}$$

$$M\text{-}OR + RO\text{-}M \rightarrow M\text{-}O\text{-}M + R\text{—}O\text{—}R \qquad \text{Equation 2:}$$

$$M\text{-}O\text{—}C(O)R' + R\text{—}O\text{-}M \rightarrow M\text{-}O\text{-}M + RO\text{—}(C(O)R \qquad \text{Equation 3:}$$

A metal oxide particle process such as described above is used to form metal oxide particles that, in one embodiment, have a diameter of five nanometers or less. To control agglomeration and limit the particle size of the metal oxide particles, the particles are end capped with organic ligands. End capping of oxide particles may be done by, for example, an esterification reaction or by a ligand exchange after synthesis and purification. The capping of the metal oxides with an organic ligand inhibits the agglomeration of the metal oxide particles allowing particle sizes of five nanometers or less that are suitable for tight pitch feature applications. Representative dimensions of openings or gaps that can be filled with the dielectric composition include gaps having a diameter or width on the order of 10 nm to 15 nm with a 10:1 aspect ratio (depth:diameter (width)).

Figure 1:
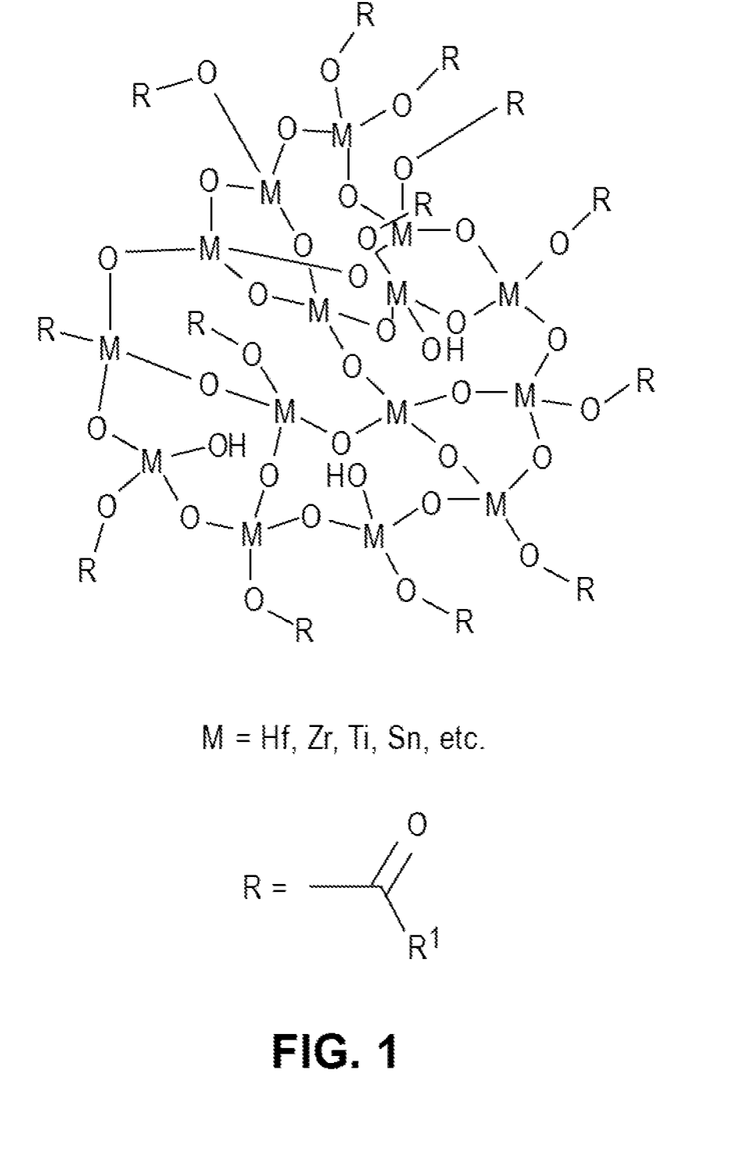
FIG. 1 shows an atomic representation of a dielectric composition of capped metal oxide particles.

A representation of the dielectric composition is illustrated In FIG. 1. FIG. 1 shows metal atoms (M) bond to oxide atoms (O) with organic ligands bound to exterior oxygen atoms. In one embodiment, the capping ligands are X-type ligands as both the ligand and the nanoparticle core contribute electrons to the chemical bond. In the representation shown in FIG. 1, the capping ligands have a carbonyl group, —C(O)R, where R is a C1-C10 chain that may be saturated (e.g., an alkyl), be unsaturated, branched (e.g., an isoalkyl) contain an aromatic moiety and/or be substituted (e.g., carbon atoms substituted with oxygen atoms) contain an aromatic moiety. Suitable molecules for capping ligands include carboxylic acids that can react with the metal oxide nanoparticles through an esterification reaction. Representative carboxylic acids include, but not limited to, methacrylic acid, benzoic acid, 4-vinylbenzoic acid, isobutyric acid, pivalic acid and acetic acid.

One example of forming hafnium nanoparticles is as follows. First, a hafnium alkoxide (e.g., hafnium isopropoxide) undergoes an acide-catalyzed hydrolysis reaction where the hafnium is hydroxylated.

The hydroxylated hafniums can condense to form a Hf—O—Hf crosslined network.

As the hydrolysis/condensation reaction occurs, an esterification reaction will occur on the shell of the formed nanoparticles, where carboxylic acid fuctional groups replace the isopropoxide ligands from the hafnium starting material. Such end capping prevents further condensation reactions from taking place at that particular site, and ultimately controls the size of the nanoparticles. In another embodiment, the esterification reaction may occur with a first carboxylic acid (e.g., oleic acid) and then that first carboxylic acid may be replaced on the surface of nanoparticle clusters with a carboxylic acid by ligand exchange by exposure of the clusters to an excess of the second carboxylic acid. Such end capping may include monodentate ligand binding or bidentate ligand binding.

Hafnium oxide nanoparticles capped with carboxylate ligands have shown greater than a 50:1 etch selectivity to oxide, nitride and typical ILD materials on blanket films. Using spin-coating and thermal cure, lab tests have demonstrated the ability of this material to fill 25 nm gaps without voiding. The hafnium oxide nanoparticles can withstand an oxygen-based plasma etch to remove a carbon-based trench wall, leaving the cured nanoparticles behind. The cured hafnium oxide film has demonstrated low leakage and can be considered as a leave-behind material.

FIGS. 2-9 show a process of utilizing the dielectric composition described above as a hardmask in an integrated circuit process operation. Specifically, FIGS. 2-9 describe a process using the dielectric composition as a hardmask to selectively form openings or vias to an underlying metal layer either by ultimately selectively removing the dielectric composition or another dielectric material formed on the metal layer.

Figure 2:
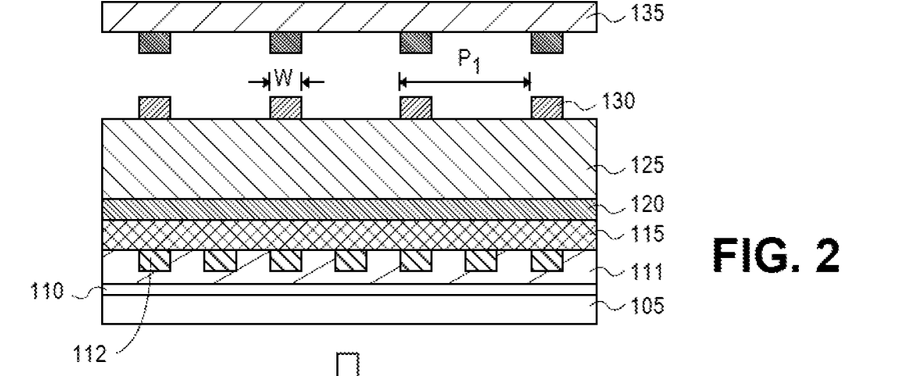
FIG. 2 shows a structure of a portion of an integrated circuit substrate including a device layer, a first interlayer dielectric (ILD) layer and first interconnect layer with a number of dielectric material layers formed on the first ILD layer according to a self-aligned double patterning process and following the deposition of a mask on the structure.

Referring to FIG. 2, FIG. 2 shows substrate 105 that is for example a semiconductor substrate as a bulk semiconductor substrate (e.g., bulk silicon substrate) or a silicon on insulator (SOI) substrate. Formed on substrate 105 is device layer 110 of, for example, transistor devices (e.g., hundreds of thousands to millions of transistor devices) and possibly other devices (e.g., capacitors resistors, etc.). Disposed on device layer 110 is dielectric layer 111 such as an initial interlayer dielectric (ILD0) of silicon dioxide or a material having a dielectric constant less than silicon dioxide (a low-k material). Formed in ILD0 are contacts to ones of devices in device layer 110 (not shown) and interconnect or metal layer 112 that is, for example, a series of metal lines or traces (e.g., copper traces) between device contacts that form circuits and transmit power throughout a substrate area. In one embodiment, metal layers 112 have a pitch, P2, that is, for example, 10 nanometers (nm) to 30 nm. In the absence of extreme ultraviolet (EUV) lithography, one option for defining openings or vias to metal lines or traces having a pitch on the order of 10 nm to 30 nm is through self-aligned double patterning (SADP) techniques. FIGS. 2-6 illustrate an example of an SADP process. Referring again to FIG. 2, overlying metal layer 112 on substrate 110 is hardmask layer 115 of, for example, silicon nitride, silicon carbide, or a dielectric composition such as described above including metal oxide particles including a metal selected from hafnium, zirconium, titanium, aluminum or tin. In one embodiment, hardmask layer 115 has a thickness on the order of 30-100 nm. In one embodiment, to form a dielectric composition of metal oxide particles, metal oxide particles would be synthesized and capped as described above. The capped particles are then dispersed in a casting solvent. A representative casting solvent is propylene glycol methyl ether acetate (PGMEA), cyclohexanone, 2-heptanone. From the casting solvent, such composition may be deposited, for example, by spin-coating. After deposition, a high temperature anneal such as an anneal temperature of 400° C. or greater for 30 minutes is used to decompose the organic ligands and solvent and convert the metal oxide into a dense film in which the nanoparticles further agglomerate. Ultraviolet or electron beam radiation may alternatively be used to decompose the ligands and solvent and form a dense film.

Overlying hardmask layer 115 in the structure of FIG. 2 is a dielectric layer that has an etch selectivity relative to bottom hardmask layer 115. An etch selectivity in this context means that a material of dielectric layer 120 may be etched or removed at a different rate with a particular etchant than a material of bottom hardmask layer 115. In one embodiment, dielectric layer 120 is a buffer oxide (e.g., silicon dioxide) deposited to a thickness on the order of 30-100 nm. Disposed on dielectric layer 120 is dielectric layer 125 of a material having an etch selectivity relative to dielectric layer 120. One suitable material for dielectric layer 125, where dielectric layer 120 is an oxide, is silicon nitride or silicon carbide. Dielectric layer 125 has a representative thickness on the order of 30-100 nm.

FIG. 2 shows the structure of the structure following the deposition of a pattern on the structure. FIG. 2 shows, for example, pattern 130 of a photoresist deposited and patterned using mask 135. Photoresist pattern 130 on dielectric layer 120 has a pitch, P1, on the order of 60 nanometers or more. In one embodiment, pattern 130 is formed with a width, W, and depth (into the page) for a desired contact opening. In this embodiment, the contact opening will be made to individual areas of lines or traces of underlying metal layer 112. Accordingly, in one embodiment, the patterned photoresist has a, W, equivalent to or less than a width of the metal lines.

Figure 3:
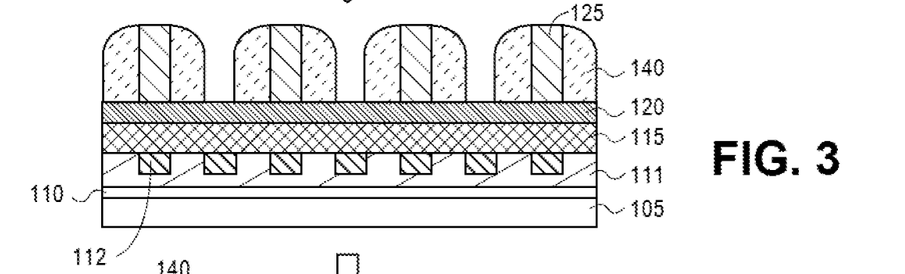
FIG. 3 shows the structure of FIG. 2 following an etch of one of the dielectric layers and a patterning of a spacer layer.

FIG. 3 shows the structure of FIG. 2 following an etch of dielectric layer 125 and the introduction and patterning of a spacer layer. In one embodiment, a material for dielectric layer 125 of silicon nitride may be etched anisotropically with, for example, phosphoric acid (H3PO4) to transpose pattern 130 into the dielectric layer. The etch proceeds through dielectric layer 125 and can be stopped on dielectric layer 120 due to a different etch rate (e.g., dielectric layer 120 of silicon dioxide having a slower etch rate with phosphoric acid than silicon nitride).

Following the etching of dielectric layer 125, pattern 130 is removed and a spacer layer is conformally deposited on the structure of patterned dielectric layer 125. Spacer layer 140 is formed on dielectric layer 120 and on the sidewalls and superior surface of dielectric layer 125. In one embodiment, spacer layer 140 is a dielectric material that may be etched selectively relative to dielectric layer 125 (e.g., an oxide). An example material for spacer layer 140 is silicon-oxide based. Once deposited, spacer layer 140 is then anisotropically etched to expose a superior surface of dielectric layer 125 creating the side wall spacer image of space layer 140 on patterned dielectric layer 125.

Figure 4:
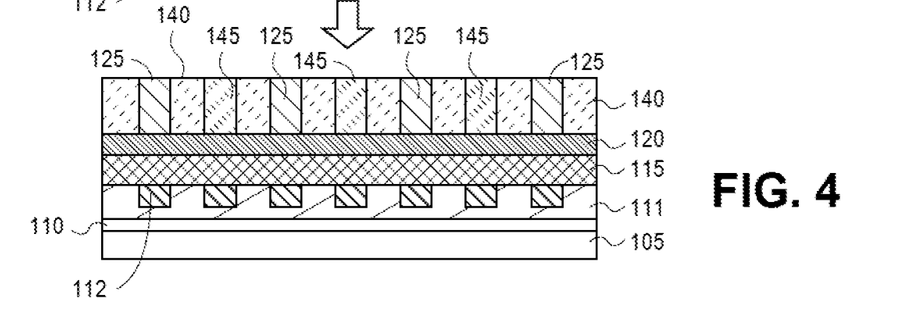
FIG. 4 shows the structure of FIG. 3 following a deposition of another dielectric layer and a planarization of the structure.

FIG. 4 shows the structure of FIG. 3 following a deposition of dielectric layer 145 on the structure. Dielectric layer 145 is, for example, a dielectric material that may be selectively etched relative to spacer layer 140 and dielectric layer 145. Where dielectric layer 125 is silicon nitride and spacer layer is is an oxide, dielectric layer 145 may be silicon carbide. Following a deposition of dielectric layer 145, a superior surface of the structure is planarized with, for example, a chemical mechanical polish.

Figure 5:
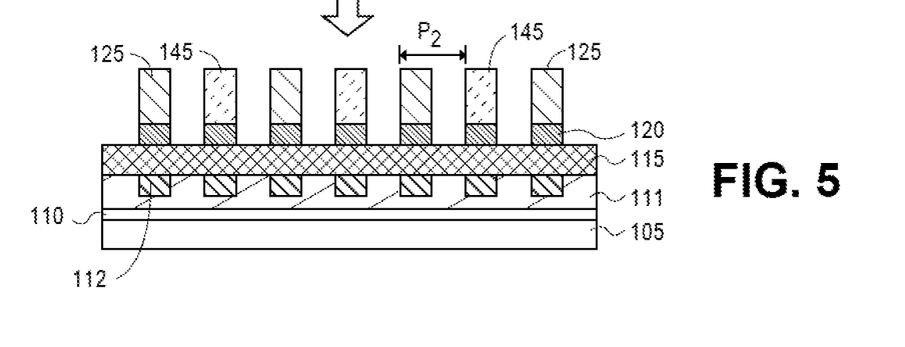
FIG. 5 shows the structure of FIG. 4 following the selective removal of the spacer layer and an underlying dielectric layer.

FIG. 5 shows the structure of FIG. 4 following the selective removal of spacer layer 140. A spacer layer of 140 of an oxide may be selectively removed relative to dielectric layer 125 of silicon nitride and dielectric layer 145 of silicon carbide using a potassium hydroxide etchant. The removal of spacer layer 140 creates a mask structure on dielectric layer 120 consisting of alternate bodies of dielectric layer 125 and dielectric layer 145. FIG. 5 also shows the structure following an etch of dielectric layer 120 using the mask of dielectric layer 125 and dielectric layer 145. Dielectric layer 120 is patterned to have a pitch P2 that is, in one embodiment, 50 percent of pitch P1.

Figure 6:
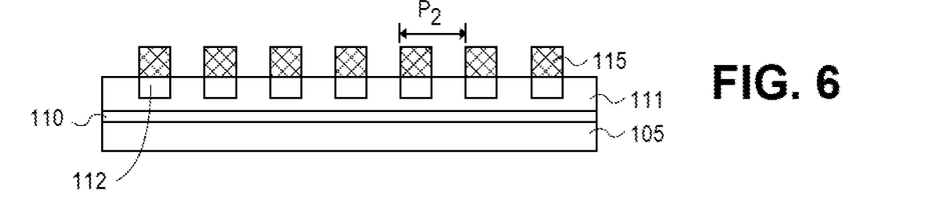
FIG. 6 shows the structure of FIG. 5 following a removal of the dielectric layers to leave a dielectric material mask of a hardmask layer on metal lines of the substrate.

FIG. 6 shows the structure of FIG. 5 following a removal of dielectric layer 125 and dielectric layer 145 and the patterning of hardmask layer 115 using the pattern of dielectric layer 120. FIG. 6 shows hardmask layer 115 disposed on dielectric layer 111 (ILD0) over or patterned on metal lines 112.

Figure 7:
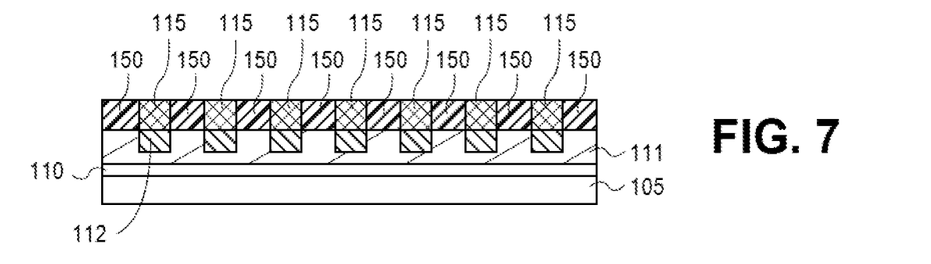
FIG. 7 shows the structure of FIG. 6 following a deposition of a dielectric material that has a different etch rate than the dielectric layer.

FIG. 7 shows the structure of FIG. 6 following a deposition of a dielectric material on the substrate. Dielectric material 150 is a material having an etch selectivity relative to hardmask layer 115. In one embodiment where hardmask layer 115 is a traditional hardmask such as silicon nitride or silicon dioxide, dielectric layer 150 is, for example, a dielectric composition of a metal oxide including a metal selected from hafnium, zirconium, titanium, aluminum or tin. Where hardmask layer 115 is a dielectric composition comprising a metal oxide of, for example, hafnium, zirconium, titanium, aluminum or tin, in another embodiment, dielectric material 150 may also be a metal oxide of one of the noted materials that has a different etch rate (different selectivity) for a particular etchant relative to a material of hardmask layer 115. For example, where hardmask layer 115 is made up of, for example, hafnium oxide particles, dielectric material 150 is made up of, for example, titanium oxide particles. A dielectric material of metal oxide particles such as described above offer the ability to fill openings having a diameter of, for example, 30 nm or less without voiding. In one embodiment, dielectric material 150 may be introduced by spin-coating and then cured to form film.

Figure 8:
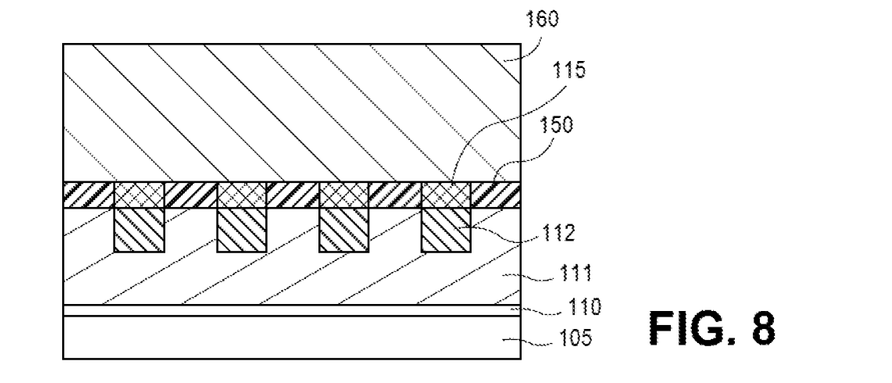
FIG. 8 shows the structure of FIG. 7 following a deposition of a second ILD layer on the structure.

FIG. 8 shows a structure of FIG. 7 following a deposition of a second ILD layer on the structure (ILD1). In one embodiment, a suitable dielectric material for dielectric layer 160 is, for example, silicon dioxide or a low-k material.

Figure 9:
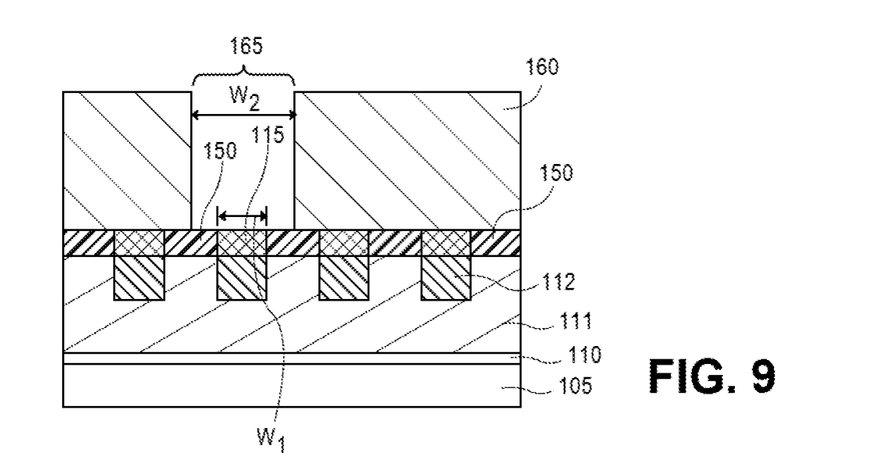
FIG. 9 shows the structure of FIG. 8 following the formation of an opening or via through the second ILD layer to the hardmask layer defined by the dielectric materials.

FIG. 9 shows the structure of FIG. 8 following the formation of an opening or via through dielectric layer 160 to the layer defined by hardmask layer 115 and dielectric material 150. To form opening or via 165 through dielectric layer 160 of for example, silicon dioxide, a suitable etchant is potassium hydroxide (KOH). The etch through dielectric layer 160 exposes both dielectric material 150 and hardmask layer 115. In this embodiment, the opening has a diameter or width, W2, greater than a diameter or width, W1, of patterned hardmask layer 115. Hardmask layer 115 is disposed on a metal line of metal layer 112 to the exclusion of dielectric material 150. In this embodiment, it is desired to subsequently only remove hardmask layer 115 and expose the metal line of metal layer 112 leaving dielectric material 150 intact.

Figure 10:
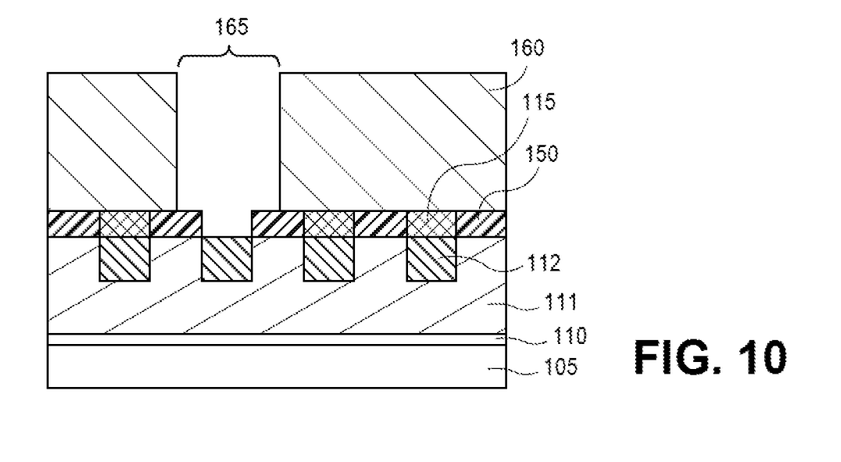
FIG. 10 shows the structure FIG. 9 following the removal of a portion of the dielectric material of the hardmask layer to expose a metal line of the first interconnect layer.

FIG. 10 shows the structure of FIG. 9 following the removal of dielectric layer 115 to expose a metal line of metal layer 112. Where dielectric layer 115 is a traditional hardmask material such as silicon nitride, and dielectric material 150 is a dielectric composition of agglomerated metal oxide particles such as hafnium, zirconium, titanium, aluminum or tin oxide nanoparticles the dielectric composition of agglomerated metal oxide nanoparticles formed as described above is highly resistant to conventional hardmask etch conditions. Thus, dielectric layer 115 may be selectively removed and dielectric material 150 retained.

Figure 11:
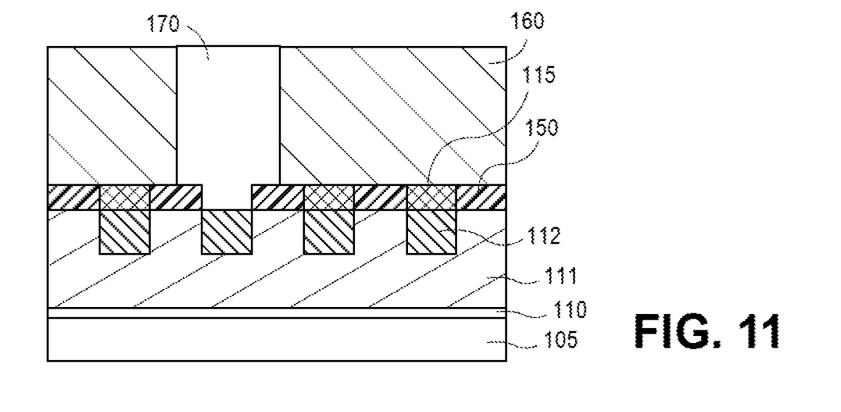
FIG. 11 shows the structure of FIG. 10 following the introduction of a metal such as copper in the opening and contacting a metal line of the metal layer.

Following the exposure of the metal layer 112 in opening or via 165, the opening or via may be filled with a metal as a contact to another layer of the integrated circuit device as is known in the art. FIG. 11 shows metal 170 such as copper deposited in opening 165 and contacting a metal line of metal layer 112.

The above embodiment described the use of a dielectric composition including a dielectric material including agglomerated metal oxide nanoparticles with a metal such as hafnium, zirconium, titanium, aluminum or tin that has good fillability into openings such as having diameters or widths on the order of 10 nm to 30 nm and is highly etch resistant to conventional hardmask etch conditions thus providing the ability to form narrow conductive vias (narrow trenches) without voiding.

Figure 12:
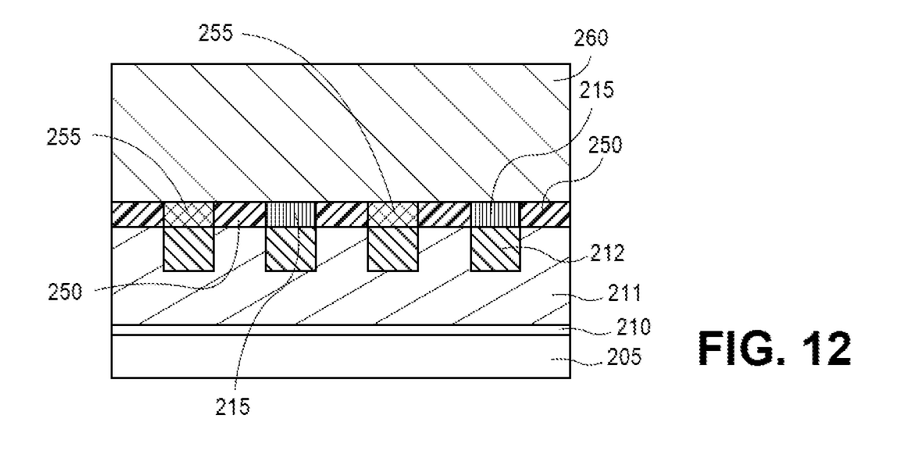
FIG. 12 shows a portion of an integrated circuit substrate including device layer, a first ILD layer, an interconnect layer, a hardmask layer on the interconnect layer and a second ILD layer on the hardmask layer according to a second embodiment such as a portion of a silicon wafer including the substrate on which a device layer is formed.
Figure 13:
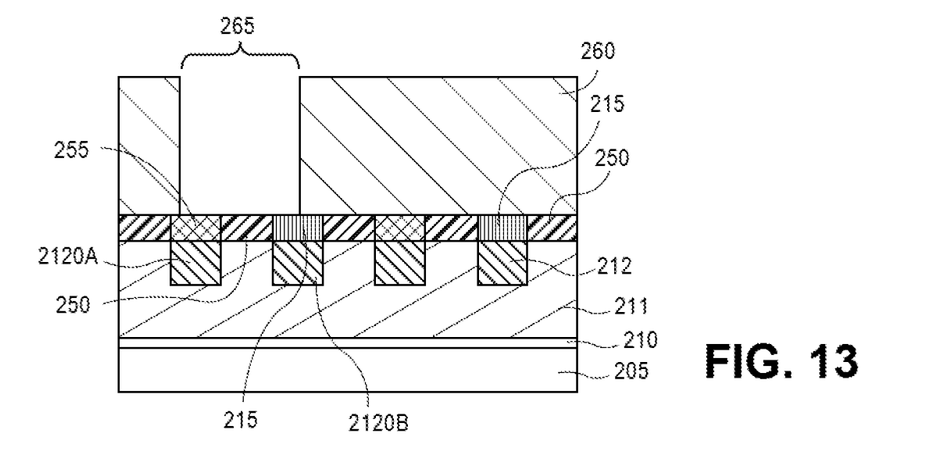
FIG. 13 shows the structure of FIG. 12 following the forming of an opening or via through dielectric layer to expose a portion of the hardmask layer.
Figure 14:
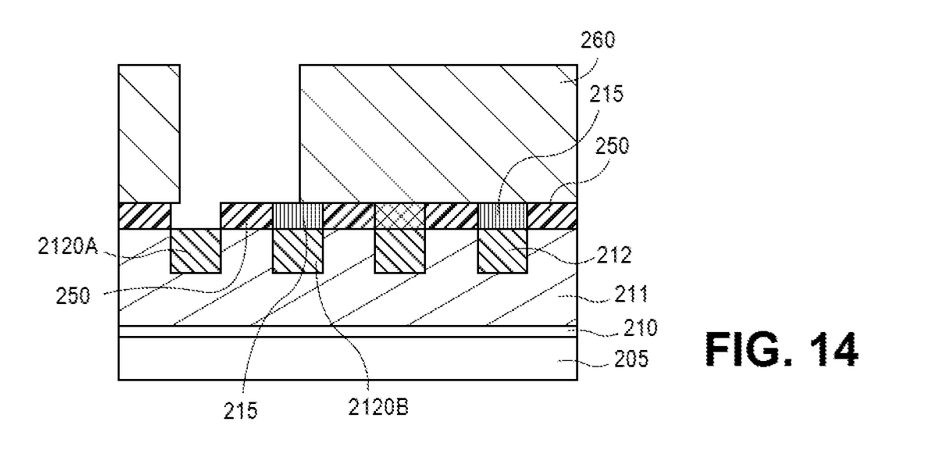
FIG. 14 shows the structure of FIG. 13 following the opening of a via to line of metal layer.

In the above embodiment, a description of landing a via on a correct metal using a hardmask layer of two contrasting hardmask materials was presented. FIGS. 12-14 show another embodiment of a process where three contrasting hardmask materials are used. In one embodiment, the three contrasting hardmask materials may include one, two or three dielectric compositions such as described above including metal oxides including a metal such as hafnium, zirconium, titanium, aluminum or tin.

FIG. 12 shows a portion of a substrate such as a portion of a silicon wafer including substrate 205 on which device layer 210 is formed. Overlying device layer is dielectric layer 211 as an ILD0 (e.g., SiO2 or a low-k material) and metal layer 212 therein including a number of metal lines or traces having a representative pitch on the order of 30 nm or less. Disposed on dielectric layer 211 is a hardmask layer including three different patterned hardmask materials, where one, two or all three of the different materials are a dielectric of metal oxide nanoparticles such as described above, (e.g., hafnium, zirconium, titanium, aluminum or tin nanoparticles). Where the hardmask layer includes more than one material of such nanoparticles, the more than one materials are different from one another in the sense that the metal cation is different. Hardmask materials of metal oxide nanoparticles may be deposited by spin coating followed by a cure to form a film. Where less than the three different patterned hardmask materials are metal oxide nanoparticles such as described above, the other(s) are, for example, a traditional hardmask material such as silicon nitride or silicon carbide. The hardmask layer of three different patterned hardmask materials may be formed according to double patterning techniques as known in the art. In the embodiment of FIG. 12, disposed on the lines of metal layer 212 are one of hardmask material 215 and hardmask material 255 with hardmask material 250 disposed there between. Disposed on the hardmask layer is dielectric layer 260 (e.g., SiO2 or a low-k material).

FIG. 13 shows the structure of FIG. 12 following the forming of an opening or via through dielectric layer 260 to expose a portion of the hardmask layer. In this embodiment, via 265 has a diameter that is greater than a pitch of the traces of metal layer 212 or is aligned over line 2120A and line 2120B of metal layer 212. FIG. 14 shows the structure of FIG. 13 following the opening of a via to line 2120A of metal layer 212. In one embodiment, the opening is formed by etching dielectric material 255 selectively relative to dielectric material 215 and relative to dielectric material 250. In one embodiment, dielectric material 215 and dielectric material 250 are each a film of metal oxide nanoparticles such as described above and dielectric material 255 is a conventional dielectric material such as silicon nitride or silicon carbide. FIG. 14 shows that dielectric material 215 and dielectric material 250 are resistant to etching by conventional hardmask etchants.

Figure 15:
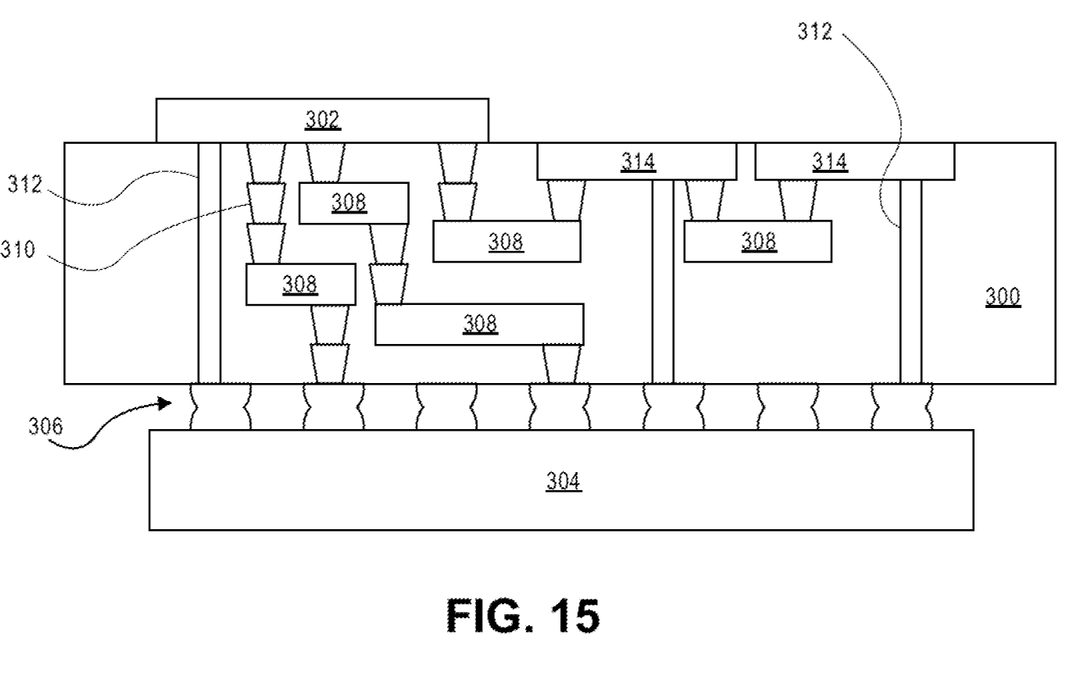
FIG. 15 is an interposer implementing one or more embodiments.

FIG. 15 illustrates interposer 300 that includes one or more embodiments. Interposer 300 is an intervening substrate used to bridge a first substrate 302 to second substrate 304. First substrate 302 may be, for instance, an integrated circuit die. Second substrate 304 may be, for instance, a memory module, a computer motherboard, or another integrated circuit die. Generally, the purpose of interposer 300 is to spread a connection to a wider pitch or to reroute a connection to a different connection. For example, interposer 300 may couple an integrated circuit die to ball grid array (BGA) 306 that can subsequently be coupled to second substrate 304. In some embodiments, first and second substrates 302/304 are attached to opposing sides of interposer 300. In other embodiments, first and second substrates 302/304 are attached to the same side of interposer 300. In further embodiments, three or more substrates are interconnected by way of interposer 300.

Interposer 300 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 308 and vias 310, including but not limited to through-silicon vias (TSVs) 312. Interposer 300 may further include embedded devices 314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 300.

In accordance with embodiments, apparatuses or processes disclosed herein may be used in the fabrication of interposer 300.

Figure 16:
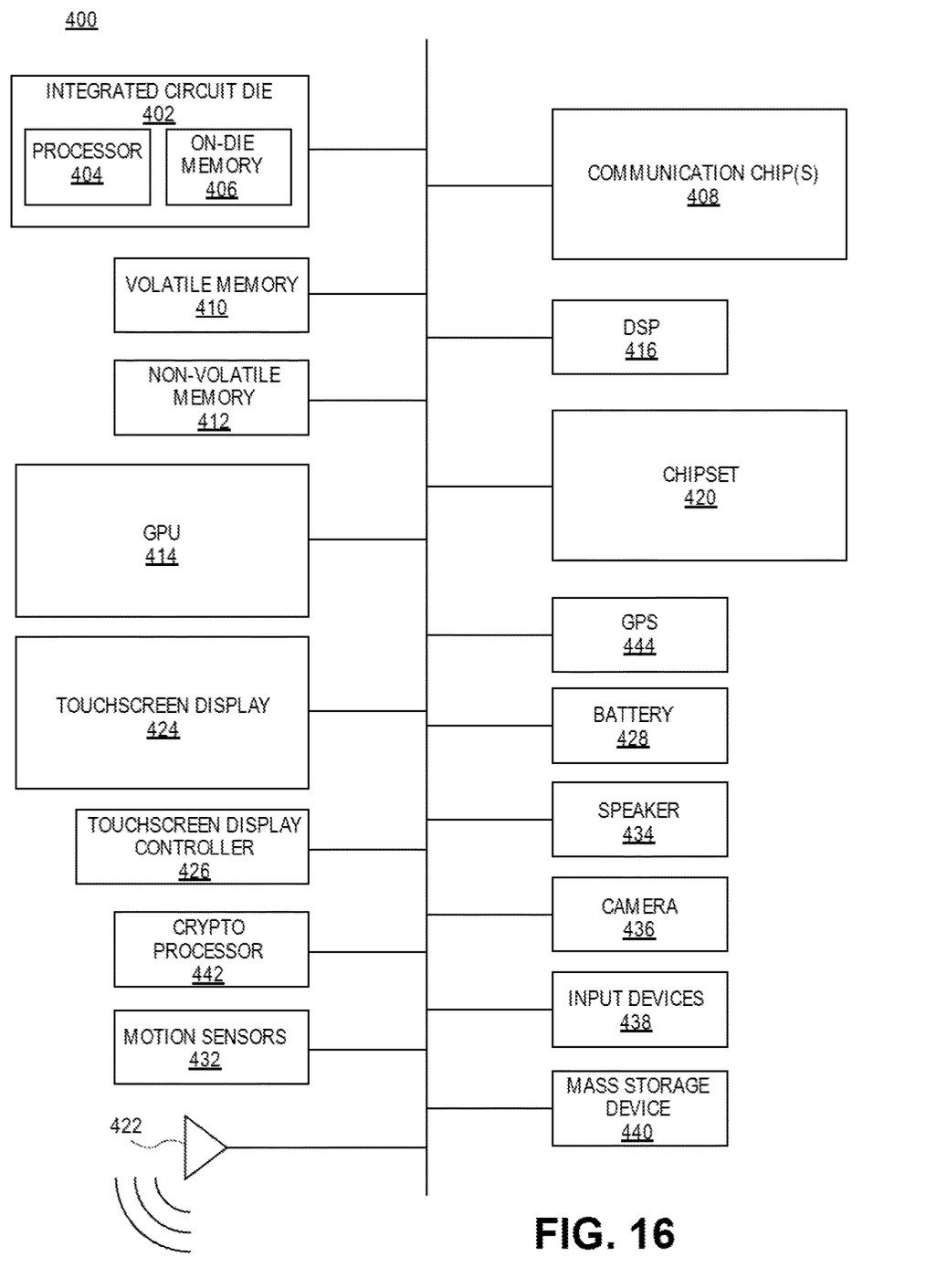
FIG. 16 illustrates an embodiment of a computing device.

FIG. 16 illustrates computing device 400 in accordance with one embodiment. Computing device 400 may include a number of components. In one embodiment, these components are attached to one or more motherboards. In an alternate embodiment, these components are fabricated onto a single system-on-a-chip (SoC) die rather than a motherboard. The components in computing device 400 include, but are not limited to, integrated circuit die 402 and at least one communication chip 408. In some implementations communication chip 408 is fabricated as part of integrated circuit die 402. Integrated circuit die 402 may include CPU 404 as well as on-die memory 406, often used as cache memory, that can be provided by technologies such as embedded DRAM (eDRAM) or spin-transfer torque memory (STTM or STTM-RAM).

Computing device 400 may include other components that may or may not be physically and electrically coupled to the motherboard or fabricated within an SoC die. These other components include, but are not limited to, volatile memory 410 (e.g., DRAM), non-volatile memory 412 (e.g., ROM or flash memory), graphics processing unit 414 (GPU), digital signal processor 416, crypto processor 442 (a specialized processor that executes cryptographic algorithms within hardware), chipset 420, antenna 422, display or a touchscreen display 424, touchscreen controller 426, battery 428 or other power source, a power amplifier (not shown), global positioning system (GPS) device 444, compass 430, motion coprocessor or sensors 432 (that may include an accelerometer, a gyroscope, and a compass), speaker 434, camera 436, user input devices 438 (such as a keyboard, mouse, stylus, and touchpad), and mass storage device 440 (such as hard disk drive, compact disk (CD), digital versatile disk (DVD), and so forth).

Communications chip 408 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 408 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 408. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 404 of computing device 400 includes one or more devices, such as transistors or metal interconnects, that are formed where connections to a devices or interconnects are formed utilizing hardmask materials including metal oxide nanoparticles describes in accordance with embodiments presented above. The term "processor" may refer to any device or portion of a device that processes electronic data from registers and/or memory to transform that electronic data into other electronic data that may be stored in registers and/or memory.

Communication chip 408 may also include one or more devices, such as transistors or metal interconnects, that are formed where connections to adevices or interconnects are formed utilizing hardmask materials including metal oxide nanoparticles describes in accordance with embodiments presented above.

In further embodiments, another component housed within computing device 400 may contain one or more devices, such as transistors or metal interconnects, that are formed where connections to adevices or interconnects are formed utilizing hardmask materials including metal oxide nanoparticles describes in accordance with implementations presented above.

In various embodiments, computing device 400 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 400 may be any other electronic device that processes data.

EXAMPLES

Example 1 is a dielectric composition including a metal oxide particle including a diameter of 5 nanometers or less capped with an organic ligand at at least a 1:1 ratio.

In Example 2, the metal oxide particles of the dielectric composition of Example 1 include a metal selected from hafnium, zirconium, titanium, aluminum and tin.

In Example 3, the organic ligand of the dielectric composition of Example 1 or 2 includes a carbonyl group, C(O).

In Example 4, the organic ligand of the dielectric composition of Example 3 includes the formula, —C(O)R, wherein R is C1-C10.

In Example 5, the dielectric composition of Example 1 further includes a casting solvent, wherein the metal oxide particles are dispersed in the casting solvent.

Example 6 is a method including synthesizing metal oxide particles including a diameter of 5 nanometers or less; and capping the metal oxide particles with an organic ligand at at least a 1:1 ratio.

In Example 7, synthesizing of the method of Example 6 includes a sol gel synthesis.

In Example 8, synthesizing of the method of Example 6 includes reducing a metal halide.

In Example 9, the metal oxide particles of any of the methods of Examples 6-8 include a metal selected from hafnium, zirconium, titanium, aluminum and tin.

In Example 10, the organic ligand of any of the methods of Examples 6-8 includes a carbonyl group, C(O).

In Example 11, the organic ligand of the method of Example 10 includes the formula, —C(O)R, wherein R is C1-C5.

In Example 12, the methods of any of Examples 6-11 further includes dispersing the capped metal oxide particles in a casting solvent.

In Example 13, the method of Example 12 further includes depositing the dispersed capped metal oxide particles on a semiconductor substrate and thermally curing to a metal oxide film on the semiconductor substrate.

Example 14 is a method including forming an interconnect layer on a semiconductor substrate; forming a first hardmask material and a different second hardmask material on the interconnect layer, wherein at least one of the first hardmask material and the second hardmask material is formed over an area of interconnect layer target for a via landing and at least one of the first hardmask material and the second hardmask material include a metal oxide including a metal selected from hafnium, zirconium, titanium, aluminum and tin; forming a dielectric layer on the first hardmask material and the second hardmask material; and forming an opening to the interconnect layer through the dielectric layer and selectively through one of the first hardmask material and the second hardmask material.

In Example 15, the first hardmask material of the method of Example 14 includes the metal oxide and forming an opening to the interconnect layer includes forming an opening through the second hardmask material.

In Example 16, forming at least one of the first hardmask material and the second hardmask material on the interconnect layer of the method of Example 14 includes depositing a solvent dispersion including capped metal oxide particles including a diameter of 5 nanometers or less and curing the deposited dispersion.

In Example 17, forming the first hardmask material and the second hardmask material of any of the methods of Examples 14-16 includes sequentially depositing the first hardmask material and the second hardmask material.

In Example 18, the first hardmask material of the method of Example 17 includes the metal oxide and forming the first hardmask material follows forming the second hardmask material.

In Example 19, after forming the second hardmask material, the method of Example 18 includes forming at least one opening in the second hardmask material to the interconnect and forming the first hardmask material includes forming the first hardmask material in the at least one opening.

In Example 20, the at least one opening of the method of Example 19 includes at least two openings separated by a pitch of 30 nanometers or less.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
   synthesizing metal oxide particles comprising a diameter of 5 nanometers or less, wherein individual ones of the metal oxide particles comprise one or more metal-oxygen-metal-oxygen-metal-oxygen six-membered rings; and
   capping the metal oxide particles with an organic ligand at at least a 1:1 ratio.

2. The method of claim 1, wherein synthesizing comprises a sol gel synthesis.

3. The method of claim 1, wherein synthesizing comprises reducing a metal halide.

4. The method of claim 1, wherein the metal oxide particles comprise a metal selected from hafnium, zirconium, titanium, aluminum and tin.

5. The method of claim 1, wherein the organic ligand comprises a carbonyl group, C(O).

6. The method of claim 5, wherein the organic ligand comprises the formula, —C(O)R, wherein R is C1-C5.

7. The method of claim 1, further comprising dispersing the capped metal oxide particles in a casting solvent.

8. The method of claim 7, further comprising depositing the dispersed capped metal oxide particles on a semiconductor substrate and thermally curing to a metal oxide film on the semiconductor substrate.

* * * * *